United States Patent [19]

Smith

[11] Patent Number: 5,207,467

[45] Date of Patent: May 4, 1993

[54] MONITOR FOR DETECTING THE ABSENCE OF AN ELECTRONIC COMPONENT ON A VACUUM PICKUP

[75] Inventor: Ted M. Smith, Austin, Tex.

[73] Assignee: International Business Machines Corporation, Armonk, N.Y.

[21] Appl. No.: 945,831

[22] Filed: Sep. 16, 1992

Related U.S. Application Data

[63] Continuation of Ser. No. 576,293, Aug. 31, 1990, abandoned.

[51] Int. Cl.⁵ .......................... B25J 15/06; B25J 19/02
[52] U.S. Cl. ...................................... 294/64.1; 29/743; 116/273; 116/276; 137/557; 294/907
[58] Field of Search ........................ 294/64.1, 65, 907; 29/743; 116/200, 215, 273, 276, 277, 272; 137/553, 557; 269/21; 271/90, 91, 94, 103, 107, 108; 279/3; 414/627, 737, 752, 793, 797; 901/40, 46

[56] References Cited

U.S. PATENT DOCUMENTS

| | | | |
|---|---|---|---|
| 2,345,819 | 4/1944 | Kirk et al. | 116/276 X |
| 2,770,208 | 11/1956 | McGurk | 116/276 |
| 2,827,008 | 3/1958 | Hodge | 116/273 |
| 3,305,171 | 2/1967 | Phillips et al. | 116/276 X |
| 3,499,204 | 3/1970 | Drop . | |
| 3,556,759 | 1/1971 | Cotter | 294/64.1 X |
| 3,697,112 | 10/1972 | Nielson et al. | 294/65 |
| 3,754,751 | 8/1973 | Capetti et al. | 294/64.1 X |
| 4,342,090 | 7/1982 | Caccoma et al. | 364/491 |
| 4,451,197 | 5/1984 | Lange | 294/64.1 X |
| 4,501,064 | 2/1985 | DiNozzi et al. | 29/832 |
| 4,599,047 | 7/1986 | Nowlin et al. | 116/273 X |
| 4,653,741 | 3/1987 | Palmer | 271/103 X |
| 4,683,654 | 8/1987 | Scholten et al. | 29/832 |
| 4,750,768 | 6/1988 | Kumar | 294/64.1 |
| 4,868,974 | 9/1989 | Nishiguchi | 29/740 |
| 4,875,614 | 10/1989 | Cipolla et al. | 228/5.5 |
| 4,892,343 | 1/1990 | Hall | 294/64.1 |

FOREIGN PATENT DOCUMENTS

| | | | |
|---|---|---|---|
| 2146705 | 3/1973 | Fed. Rep. of Germany | 294/64.1 |
| 2629160 | 1/1978 | Fed. Rep. of Germany | 294/64.1 |
| 3036272 | 5/1982 | Fed. Rep. of Germany | 294/65 |
| 254436 | 11/1986 | Japan | 294/907 |

| | | | |
|---|---|---|---|
| 553640 | 5/1943 | United Kingdom | 116/273 |

OTHER PUBLICATIONS

IBM Technical Disclosure Bulletin, "Integrated Circuit Chip Positioning Tool," vol. 13, No. 7, Dec. 1970, pp. 2115-2116.

IBM Technical Disclosure Bulletin, "Vacuum Pickup for Wafers," vol. 13, No. 7, Dec. 1970, p. 2117.

IBM Technical Disclosure Bulletin "Automatic Height Sensing and Adjusting System," vol. 19, No. 9, Feb. 1977, pp. 3502-3503.

IBM Technical Disclosure Bulletin, "Device Repositioner," vol. 20, No. 11B, Apr. 1978, pp. 4711-4713.

IBM Technical Disclosure Bulletin, "Multiple Size Chip Pickup, Orientation and Placement Station," vol. 22, No. 7, Dec. 1979, pp. 2757-2761.

IBM Technical Disclosure Bulletin, "Chip-Placement Machine," vol. 23, No. 5, Oct. 1980, pp. 1755-1757.

IBM Technical Disclosure Bulletin, "Assembly Technique for Placing Electronic Components on Printed Circuit Wiring Patterns," vol. 31, No. 10, Mar. 1989, pp. 222-228.

Primary Examiner—Johnny D. Cherry
Attorney, Agent, or Firm—Mark E. McBurney

[57] ABSTRACT

A system is provided for determining the presence, or absence of a component on the end of a vacuum pickup device. A monitor having a transparent body portion and plural air flow passageways is provided. An indicator is provided for each vacuum pickup device and contained within the air flow passageway intermediate a vacuum source and the vacuum pickup device. The position of the indicators within the flow passage is dependent upon the presence, or absence of a component on the end of the vacuum pickup device. With a component present on the pickup device, air flow through the passageway, due to the application of the vacuum source, is minimal and the indicator will be biased in a first direction. However, when a component is absent the pickup device, substantial air flow occurs through the passageway, thereby biasing the indicator in a second direction. In this manner, an operator can visually inspect the monitor of the present invention to determine if each vacuum pickup device has a component affixed thereto.

5 Claims, 6 Drawing Sheets

MONITOR FOR DETECTING THE ABSENCE OF AN ELECTRONIC COMPONENT ON A VACUUM PICKUP

This is a continuation of application Ser. No. 07/576,293 filed Aug. 31, 1990, now abandoned.

BACKGROUND OF THE INVENTION

The present invention generally relates to the production of electronic circuit cards wherein a number of individual electronic components are concurrently affixed to a card. The number of components being affixed may number into the hundreds and the absence of a single component will cause the circuit card to be defective. A vacuum pickup system is used to place each component onto the card being assembled. The present invention is a system for determining whether each vacuum pickup does in fact have an electronic component contained thereon. These electronic components may include integrated circuits, resistors, capacitors, or the like.

Conventional means of sensing components on vacuum pickup devices include using pressure transducers which sense the pressure differential created when air flows through a restriction in the vacuum device. Optical sensors and cameras have also been used to identify the presence of components on the vacuum pickup devices. For example, Scholten et al U.S. Pat. No. 4,683,654 utilizes an acoustic generator in the air flow path between the vacuum pickup and the vacuum source. In this manner, an audible sound is used to alert a system operator. Further, a microphone may be used to convert this audible sound into an electrical signal. However, a signal processing unit including a high-pass filter, amplifier and limit value adjustment device must be utilized to process this signal transmitted from the microphone. The threshold value of the audible noise generated from the acoustic generator must be adjusted to a minimum value which will be processed and used to indicate the absence of a component on the vacuum pickup device. Additionally, due to improper adjustment of this threshold value and the presence of external noises, which will be present in the manufacturing environment contemplated by Scholten et al, inaccuracies may occur wherein erroneous indications regarding the presence of components are likely.

It would be advantageous to have a visual indication of the presence, or absence of a component on the end of a vacuum pickup device. This indication would be entirely independent of any extraneous noises and provide a reliable indicator of the presence or absence, of these components.

SUMMARY OF THE INVENTION

In contrast to the prior art, the present invention provides a visual indication of the presence, or absence, of a component on the end of a vacuum pickup device. The present invention is capable of presenting an extremely accurate indication of the status of the vacuum pickup, while being able to provide this indication for a virtually unlimited number of these vacuum pickup devices. Additionally, the present invention is capable of easily converting this visual indication into an electrical signal for input to an operator terminal, or the like, without the need to provide any type of high-pass filter, amplification, or threshold adjustment device.

The present invention includes a body member, having a transparent portion and numerous cavities contained therein. Each of these cavities are located intermediate of, and in communication with a common vacuum source and an individual vacuum pickup device. These cavities include a substantially vertical portion having an indicator contained therein. This indicator is normally biased towards the bottom of this portion of the cavity, but will be forced to the top portion of the cavity when a component is absent from the vacuum pickup device, as described below. The common vacuum source is proximate the top of the substantially vertical cavity portion, containing the indicator, whereas each individual vacuum pickup device is proximate the other end of each of the substantially vertical cavities.

If a component is attached to the end of the vacuum pickup device, then the flow of air to the vacuum source is restricted and the indicator remains, due to predetermined biasing such as gravity or a spring, at a first position (generally the bottom) in the substantially vertical cavity. Alternatively, if a component is absent from the end of the vacuum pickup device, then the flow of air to the vacuum source is unrestricted and the indicator rises to a second position (generally the top) within the substantially vertical portion of the cavity. Thus a visual indication of the status for each vacuum pickup device can be made by observing the indicators through the transparent portion of the body, which houses the cavity having the indicator contained therein.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
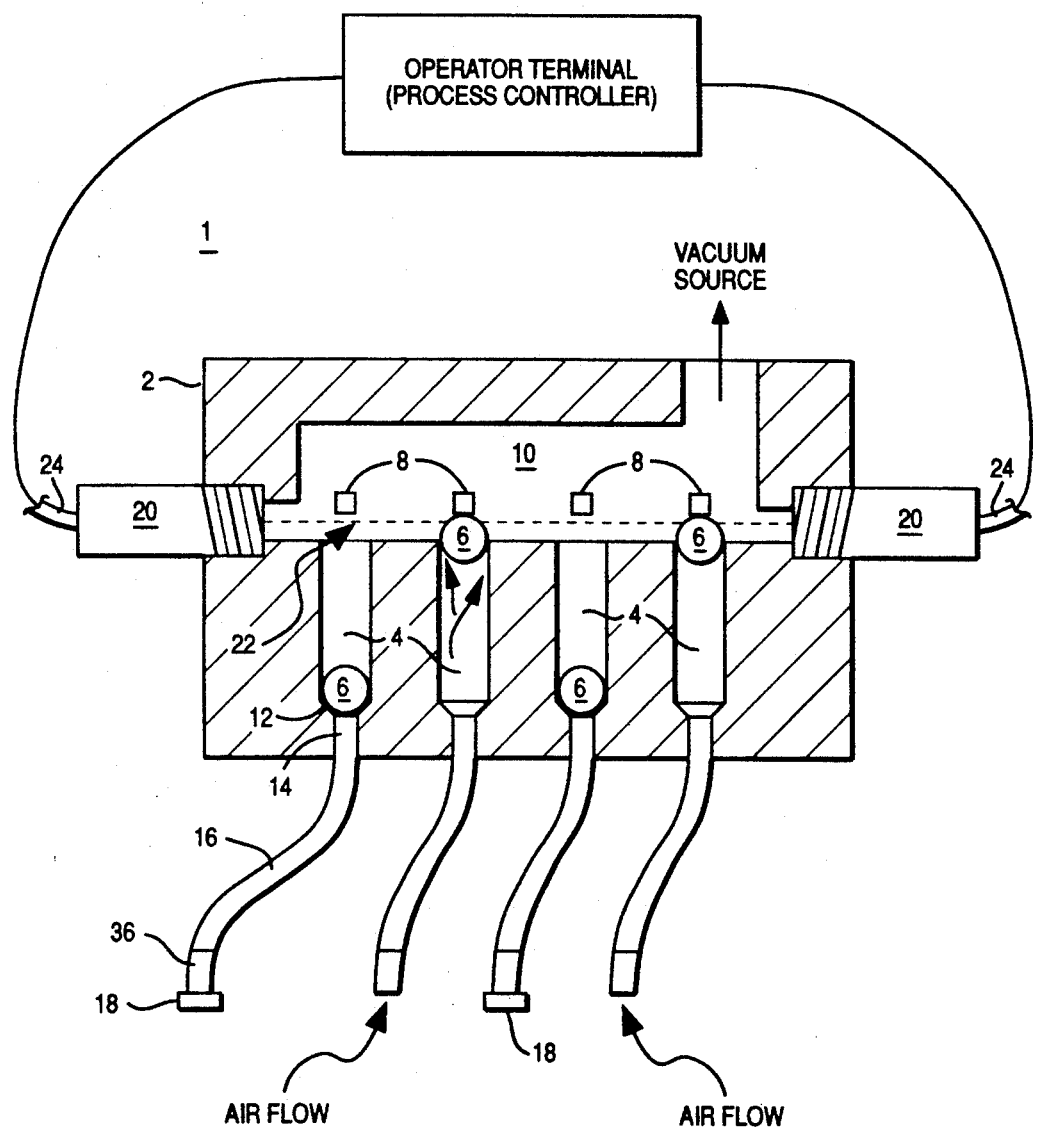
FIG. 1 is a schematic diagram of a front elevation of a first embodiment of the present invention showing the transparent body portion, vertical cavities and indicators.

Referring to FIG. 1, a cross-sectional view of the first embodiment of the present invention is shown and is generally noted by reference numeral 1. Body member 2 is shown including chamber 10, as well as a plurality of vertical cavities 4. Body member 2 is preferably constructed of a transparent material such as a clear epoxy, polymer, or the like. Alternatively, a transparent portion can be used in conjunction with an opaque member 2, with the transparent portion proximate cavities 4 such that indicators 6 can be viewed by an operator of the electronic circuit card manufacturing process. Indicators 6 are preferably small spherical objects, which are sensitive to pressure differences occurring across body member 2. Indicators 6 are capable of axial movement within vertical cavity 4, this movement being restricted on the top by restraints 8, such as pins or the like. Indicators 6 are restricted at the bottom of vertical cavity 4 by the presence of annular shoulder 12. When no vacuum source is present on chamber 10, indicator 6 will rest upon annular shoulder 12, due to the force of gravity. A passageway 14 then connects the bottom of vertical cavity 4 with a resilient member such as a tube 16 which can be utilized to affix a component 18 to the end thereof. Component 18 is preferably an electronic component such as an integrated circuit, resistor, capacitor or the like which is to be used in fabricating an electronic circuit card.

Again, referring to FIG. 1, the operation of a first embodiment of monitor 1 of the present invention will now be described. Under normal operating conditions the vacuum source is applied to chamber 10 which is transferred through vertical cavity 4, passageway 14, resilient tube member 16 and pickup device 36 in order to affix a component 18 to the end of pickup device 36. The vacuum source provides suction which causes component 18 to be affixed to the end of device 36. Component 18 can then be placed upon a circuit card being fabricated. It can be seen that when component 18 is in fact affixed to the end of device 36, there is minimal or no, airflow from the external environment through vacuum pickup device 36, tube 16, cavity 4, and chamber 10 to the vacuum source. Thus, indicator 6 is not exposed to any significant airflow and the force due to gravity causes indicator 6 to remain at rest upon annular shoulder 12. However, if it is assumed that a component 18 is absent from the end of member 16 then it can be seen that a substantial amount of air flows from the outside environment through device 36, tube 16, cavity 4 chamber 10 and to the vacuum source. In this case, the airflow forces indicator 6 to move vertically upward within cavity 4 until this upward travel is restricted due to retaining pin 8. Therefore, it can be seen that an indicator 6 which rests upon annular shoulder 12 indicates that a component 18 is present on the end of vacuum pickup device 36. Conversely, an indicator 6 which is at the top of vertical cavity 4 adjacent restraining member 8, will indicate that component 18 is not present at the end of device 36. An operator of a manufacturing system can visually inspect monitor 1 and readily determine if all of the required components are present.

An electrical signal which indicates the presence, or absence, of a component on the end of pickup device 36 can be generated by use of a photo optic sensor 20. When component 18 is absent and an opaque indicator 6 rises vertically through cavity 4 to rest adjacent pin 8, the light beam 22 between photo sensors 20 is broken and an electrical signal is transmitted through wires 24 to an operator terminal (not shown) or the like.

A second embodiment of the present invention will now be described with reference to FIGS. 2A and 2B.

It should be noted that like reference numerals refer to similar components as they are described with reference to the various embodiments of the present invention. FIGS. 2A and 2B represent a monitor 1 capable of being used in manufacturing of electronic circuit cards wherein large numbers of components are required to be affixed to the cards. The monitor of FIGS. 2A and 2B is capable of providing an indication of the presence, or absence, of virtually hundreds of components to be affixed during fabrication of the electronic circuit cards. Reference numeral 30 generally indicates the monitor represented by FIGS. 2A and 2B. Transparent body member 2' is shown including a plurality of vertical cavities 4' aligned along one side thereof. Chamber 10' is included within body 2' and in communication with a vacuum source (not shown) through a hole 32 within a top cap 34 and further through hose flange 38 and coupling 40. Top cap 34 engages hose flange 38 by conventional means such as threaded engagement, or the like. Similarly, hose flange 38 is affixed to top cap 34 by conventional means such as threaded screw 48 and holes 50 and 52. Top cap 34 is secured to body member 2' through conventional means such as threaded screws 42 through holes 44 and 54. A resilient sealing means 46 is provided which maintains the pressure differential between chamber 10' and the outside environment and prevents airflow between top cap 44 and body member 2' from occurring. The resilient seal means 46 may be fabricated from rubber, or any other elastomeric resilient material which provides an air tight seal. End caps 56 are affixed to both the left and right ends of body member 2' using conventional means such as threaded screws 58, through holes 60, or the like. End caps 56 are used such that optical sensors 20 may be mounted thereto through threaded engagement, or the like. A resilient seal 62 is utilized in conjunction with each end cap to prevent any pressure differential which could occur between chamber 10' and the outside environment via hole 64. Hole 64 is utilized to provide a line of sight path between optical sensors 20 which are mounted on each body member 2'.

Figure 2A:
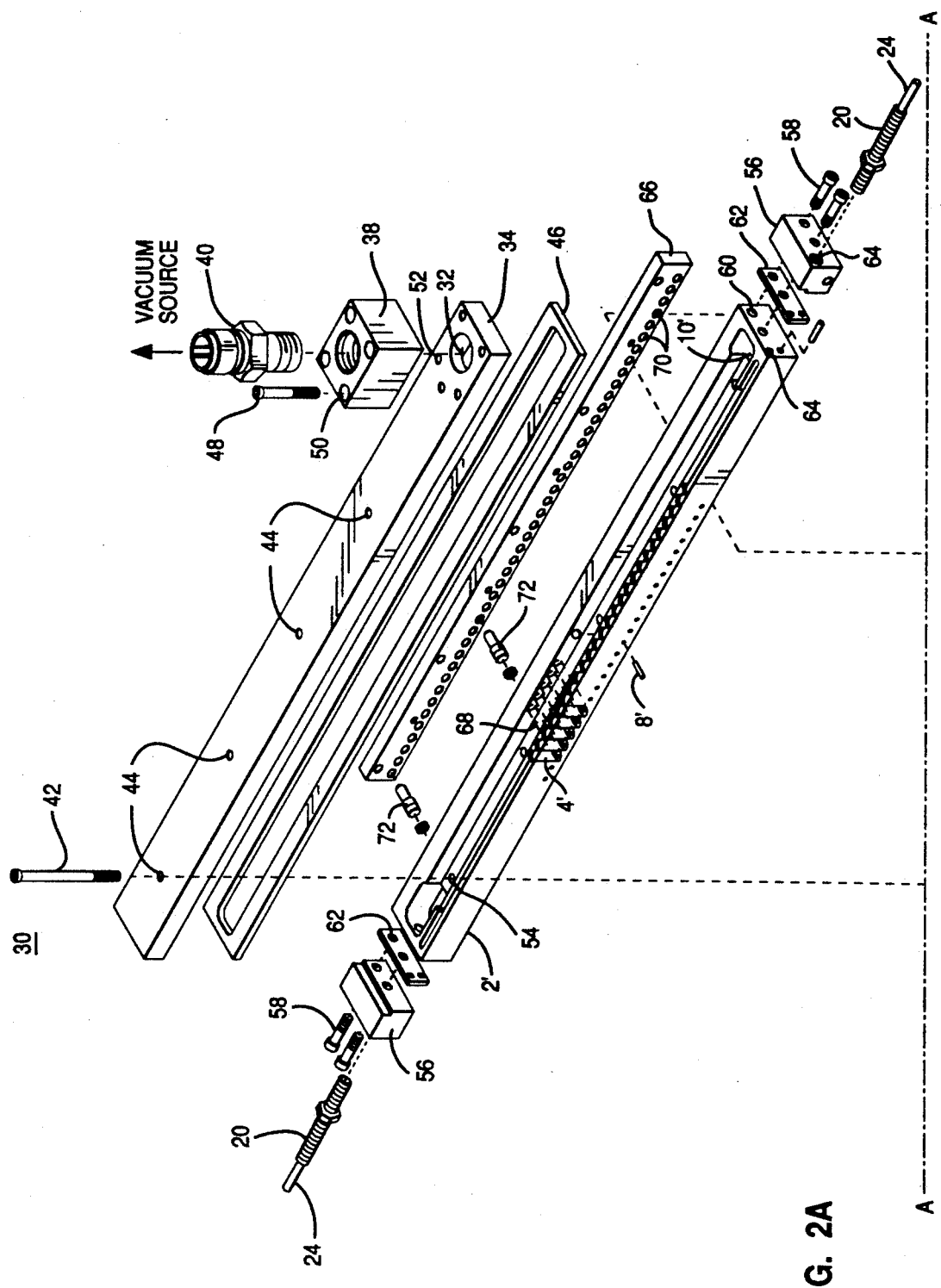
FIGS. 2A and 2B are exploded diagrams of another embodiment of the present invention.
Figure 2B:
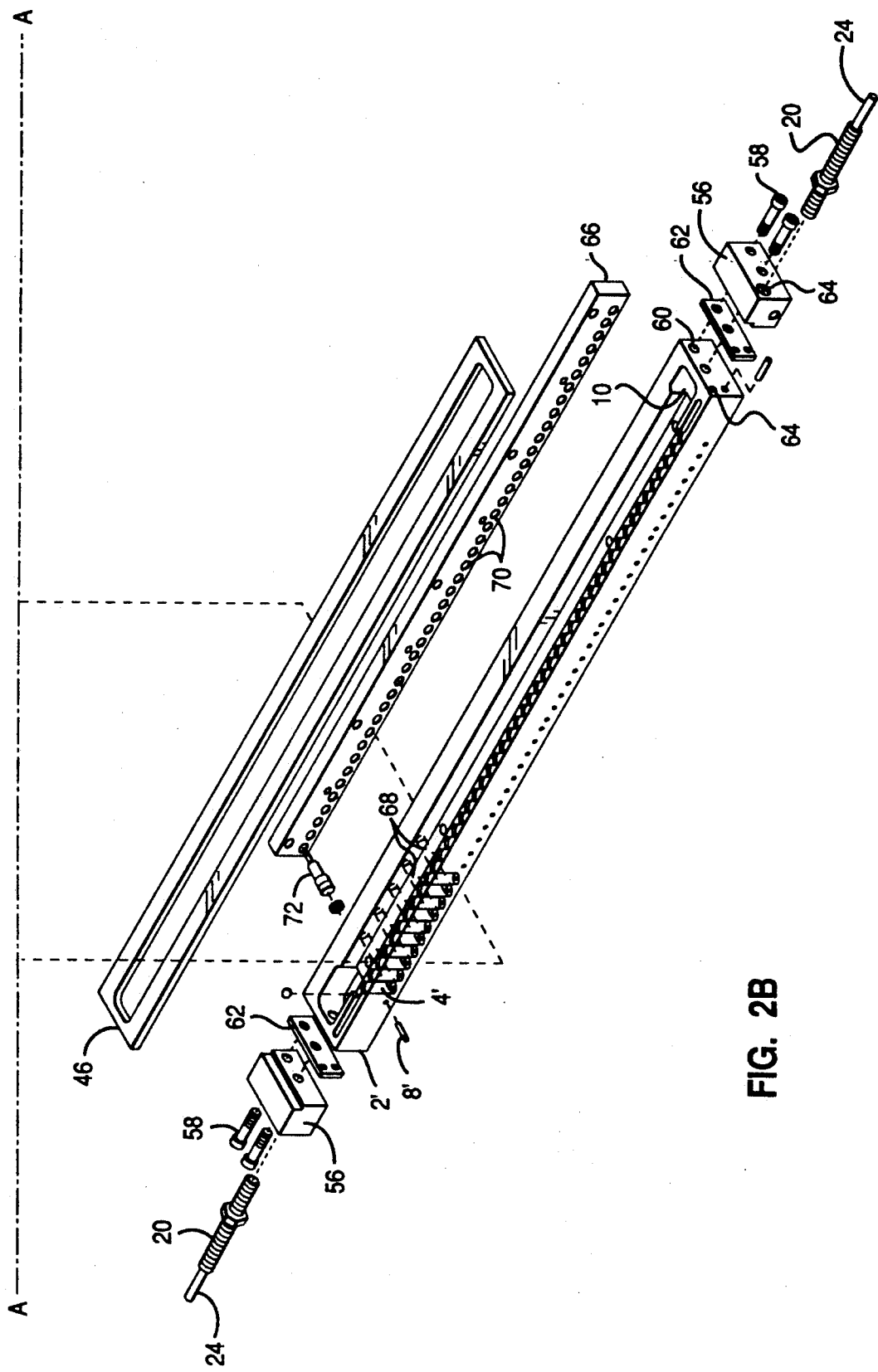

In the embodiment shown in FIGS. 2A and 2B, vertical cavity 4' is in communication with an additional cavity 68. The cavity 68 functions to connect vertical cavity 4' with a vacuum pickup device 36 (FIGS. 1, 5 and 6) which engages component 18. A fitting retainer 66, having a plurality of holes 70 therethrough, is affixed to body member 2' on a side opposite of vertical cavity 4'. Fittings 72 are individually attachable to fitting retainer 66 such that all of the fittings associated with individual body member 2' can be removed, or installed, with one operation. It can be seen that installing or removing individual fittings 72, associated with hundreds of vacuum pickup devices 36 would require a substantial amount of time and effort that may be more efficiently spent on other tasks. In this embodiment, pin 8' is used in conjunction with each vertical cavity 4' such that indicator 6 included within cavity 4', will rest upon retaining pin 8' due to the force of gravity. A bottom edge of top cap 34 is used to restrict upward vertical movement of indicator 6' within cavity 4' when components are absent from vacuum pickup device 36.

It can be seen from FIGS. 2A and 2B that multiple body members 2' can be stacked upon each other in order to provide indication regarding the absence or presence of components for numerous vacuum pickup devices 36. When multiple body members 2' are stacked, chambers 10 remain in communication with one another through holes (not shown) extending through body member 2' which allow the vacuum source to be applied to each of the body members 2'.

The operation of monitor 30 as shown in FIGS. 2A and 2B is similar to the operation of the monitor 1 of FIG. 1. That is, indicators 6' contained in vertical cavity 4' will remain adjacent to pin 8', due to the force of gravity, when components are present on pickup device 36. However, when a component is not present on the end of vacuum pickup device 36, an indicator 6 will rise vertically within cavity 4' until contact with an edge of top cap 34 or the bottom of an adjacent stacked body member 2' is made. Thus, an operator can visually determine whether each vacuum pickup device has a component present thereon. Similarly, optical sensors 20 can be utilized on each end of body member 2' to determine whether any of the vacuum pickup devices 36 associated with a particular body member 2' do not have a component attached thereto. It should be noted that the electrical indication will allow an operator to determine that at least one pickup device is missing a component. Further, the operator will be able to determine which group of vacuum pickup devices do not have a component attached thereto, i.e. that group of pickup devices 36 associated with a specific body member 2'.

Figure 3:
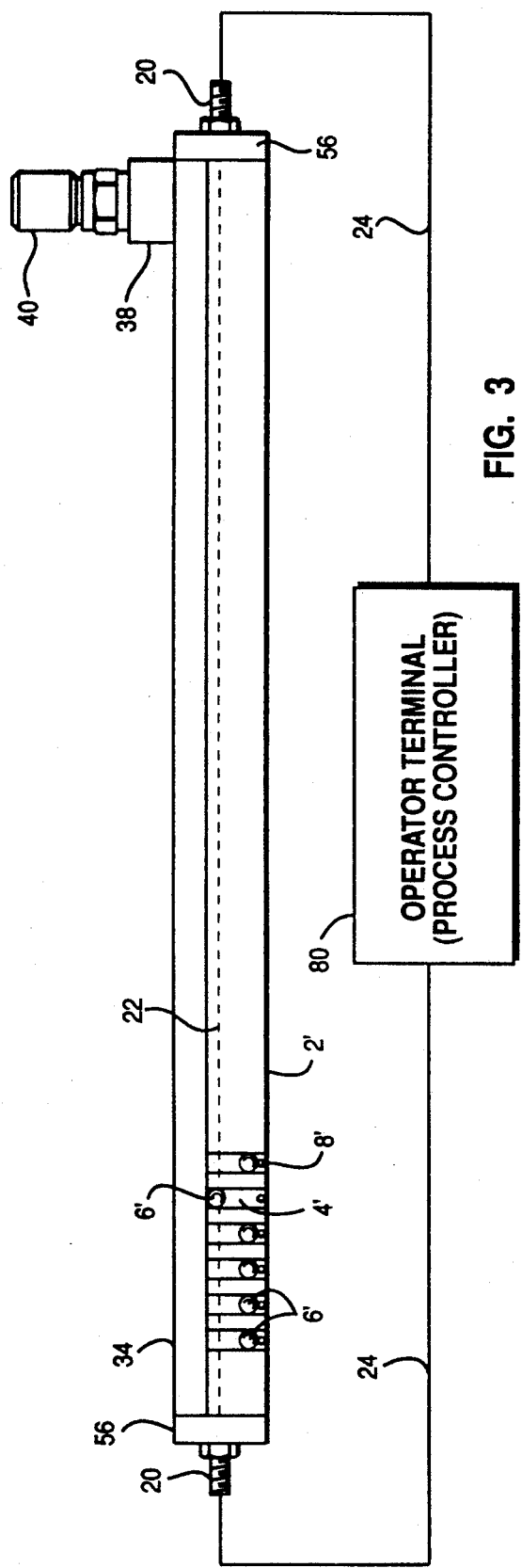
FIG. 3 is a schematic diagram of the embodiment of FIG. 2 having optical sensors electrically connected to an operator terminal, or other type of display means.

FIG. 3 is a front elevation view of the present invention as embodied in FIGS. 2A and 2B. Although six distinct cavities 4' are shown by FIG. 3, it should be noted that numerous cavities are contemplated by the present invention and are limited only by physical constraints. It can be seen that one of the indicators 6' is showing the absence of a component on the end of a vacuum pickup device 36. Further, the light beam 22 between photo sensors 20 is broken by the indicator 6', which has been forced to the upper portion of vertical cavity 4' due to the airflow therethrough. The interruption of light beam 22 causes an electrical signal to be transmitted along wires 24 to an operator terminal of the electronic circuit card manufacturing processing controller 80. Any of a number of currently available computing devices can be utilized as process controller 80. For example, the IBM PS/2 (PS/2 is a trademark of IBM Corporation) Model 80 can be used in this application. Thus, it can be seen that once an electrical indication corresponding to the absence of a component on vacuum pickup device 36 is transmitted to the operator terminal 80, it is merely a matter of visually inspecting the indicators 6' to determine which one of the vacuum pickup devices 36 is missing a component 18. In order to facilitate this determination, labels can be used along each of vertical cavities 4' in order to readily determine which one of the plural vacuum pickup devices 36 is missing a component.

Figure 4:
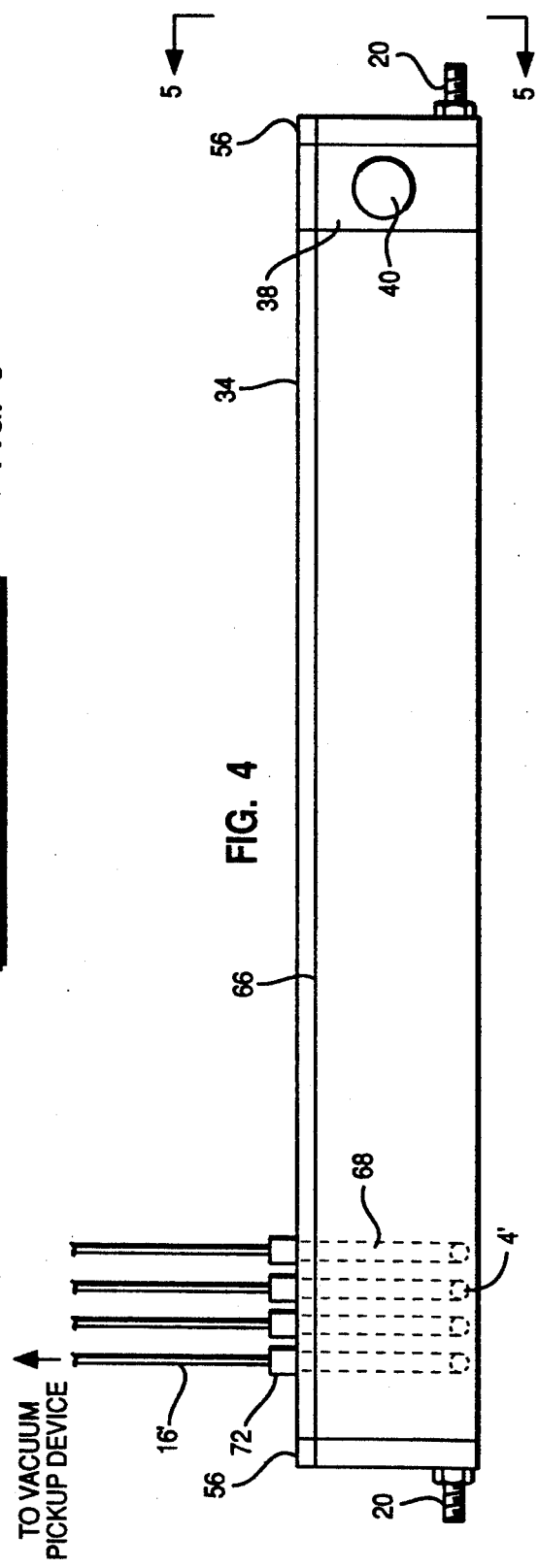
FIG. 4 is a plan view of the embodiment of FIG. 2 wherein the individual vacuum lines which allow communication between the vacuum pickup devices and the cavity are shown.

FIG. 4 is a plan view of the embodiment of FIG. 2 and shows the relationship between vertical cavity 4', cavity 68, fitting 72 and tube 16. It can be seen that when a component 18 is absent from the end of vacuum pickup device 36, the air will flow through pickup device 36, tube 16 fitting 72, cavity 68 and vertical cavity 4', thereby forcing indicator 6' to the upper portion of vertical cavity 4'. As previously noted, the airflow is due to the vacuum source applied at coupling 40 and communication with the previously described flow path via chamber 10. This flow path constitutes vacuum pickup device 36, tube 16', fitting 72, cavity 68, substantially vertical cavity 4', chamber 10', flange 38 and coupling 40.

Figure 5:
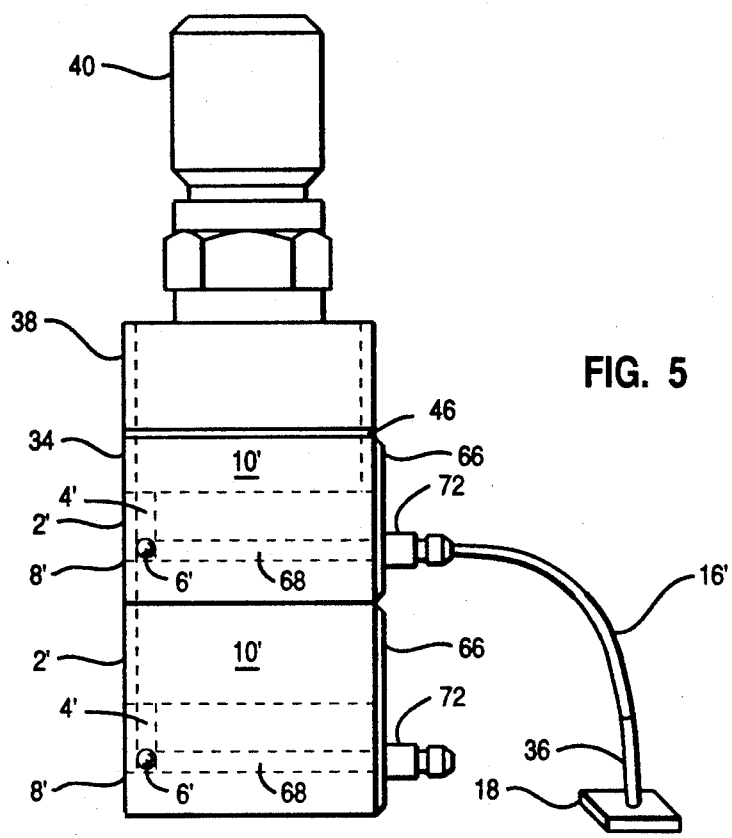
FIG. 5 is a side view of the embodiment of FIG. 2 taken along lines 5—5 of FIG. 4.

FIG. 5 is a right side elevation view taken along line 5—5 of FIG. 4. Again, the airflow path from vacuum pickup device 36, resilient tube member 16, fitting 72, cavity 68, vertical cavity 4' and chamber 10' through flange 38 and coupling 40 can be seen. Further, it can be seen that due to the presence of component 18 on the end of vacuum pickup device 36, the indicator 6 resides adjacent pin 8' due to the force of gravity and the lack of airflow through the flow path due to the blockage by component 18.

Figure 6:
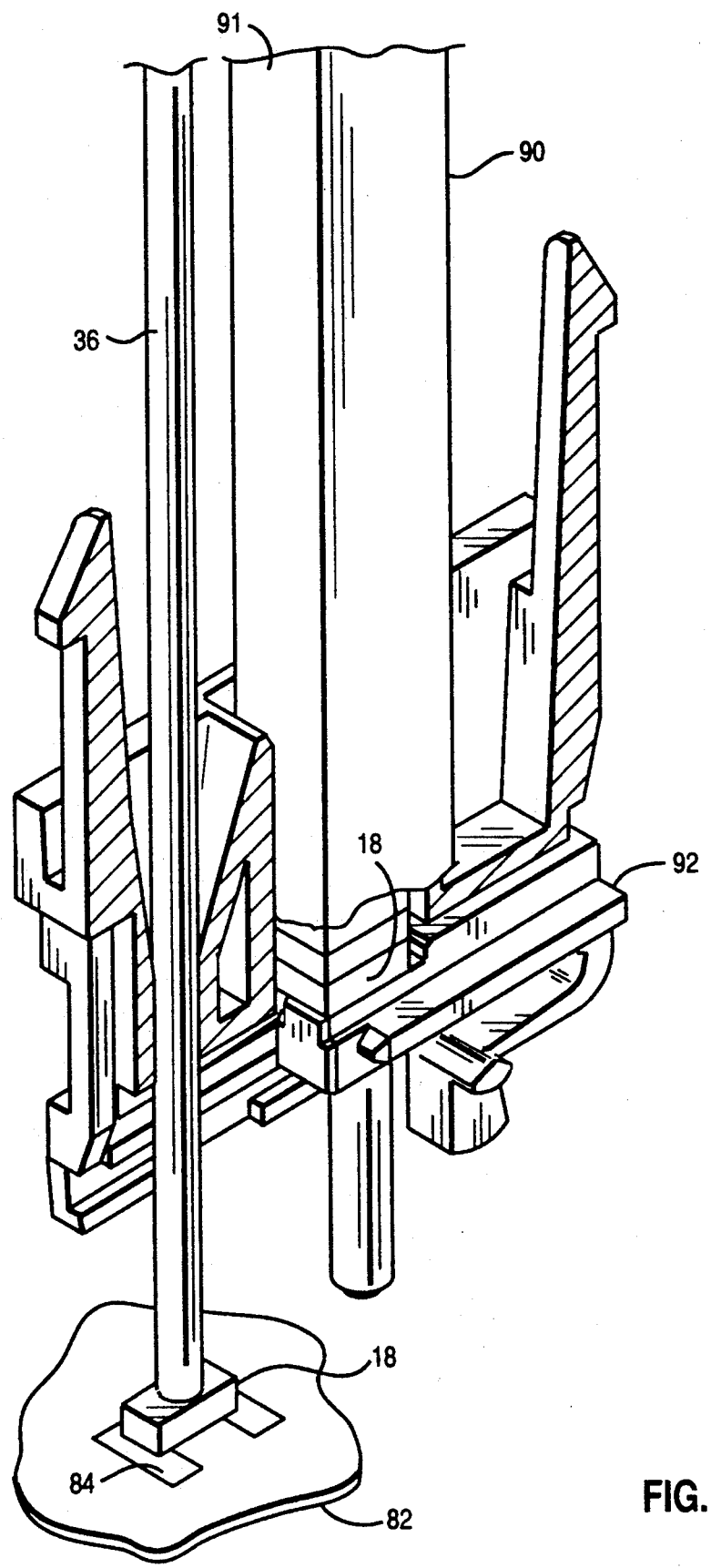
FIG. 6 is perspective diagram showing the vacuum pickup device used in conjunction with a component feeder, and further showing a component present on the end of the vacuum pickup device

One application of the present invention to the electronic circuit card fabrication process is shown in FIG. 6. Generally, a component feeder device is represented by reference numeral 90 which includes a magazine 91 having a plurality of components 18 stacked vertically therein. A shuttle mechanism 92 transports the bottommost component 18 horizontally towards vacuum pickup device 36 which is retracted upwardly during that portion of the operation. When component 18 is aligned directly underneath vacuum pickup device 36, device 36 is lowered to contact component 18 and the vacuum source is applied such that component 18 is affixed to the end of device 36. At this point, shuttle mechanism 92 retracts and vacuum pickup device 36 is lowered such that component 18 contacts a substrate 82 at a point where glue, or other bonding means 84 is aligned with component 18. Substrate 82 is continually moving such that components 18 are placed at various positions thereon. Once component 18 is placed on substrate 82, vacuum pickup device 36 is retracted and the process starts again. Thus, FIG. 6 illustrates an application of the present invention wherein a malfunction in shuttle mechanism 92, which causes component 18 to be absent from pickup device 36, can be readily detected.

Figure 7:
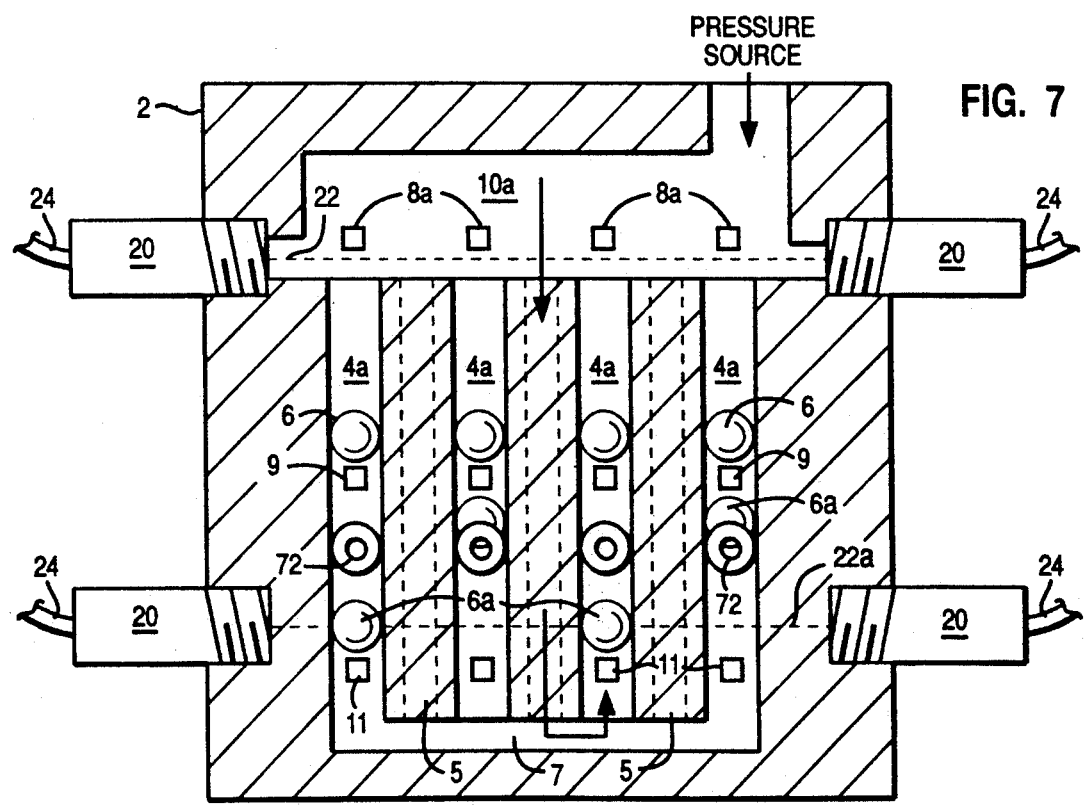
FIG. 7 is another embodiment of the present invention wherein the blockage of the vacuum pickup devices can be checked prior to initiation of the manufacturing process.

FIG. 7 illustrates yet another embodiment of the present invention. The embodiment of FIG. 7 provides all of the functions as previously discussed with FIGS. 1-6 and provides added capability which allows an operator of an electronic circuit card manufacturing process to determine whether any of the airflow passages is blocked prior to initiating the manufacturing process. It is possible in this type of manufacturing environment for bits of glue solder or the like to become lodged within vacuum pickup device 36, thus impeding the vacuum to be applied to component 18. In order to detect this blockage the embodiment in FIG. 7 includes additional airflow passageway 5, and connecting chamber 7. Further, additional retaining pins 9 and 11 are provided within vertical cavity 4a and disposed below retaining pin 8a. Additional indicators 6A (similar to indicators 6) are provided and contained within vertical cavity 4a and disposed intermediate of retaining pins 9 and 11. Thus, indicators 6A are capable of axial movement within vertical cavity 4a, but limited in this movement between retaining pins 9 and 11. It can be seen that an additional airflow path is now present from chamber 10a through passageway 5 chamber 7 and fitting 72, which is attached to resilient tube member 16 and vacuum pickup device 36, as previously described. In order to determine whether any blockage exists at pickup device 36 pressure is applied through chamber 10 which is then transferred to passageway 5 chamber 7 and to vacuum pickup device 36, via fitting 72 and resilient tube member 16. It should be noted that passageways 5 and cavity 7 are depicted in FIG. 7 and utilized by this embodiment of the present invention; however, any means of applying pressure to cavity 4a opposite chamber 10a can be used. For example, an external tube, or hose could be used to provide pressure from chamber 10a to chamber 7. In the event that blockage of pickup device 36 occurs, air flow from the pressure source (not shown) at chamber 10a and through passageway 5, chamber 7 and out fitting 72 will be minimal due to the blockage of the flow passageway. Thus, because of the minimal airflow, indicator 6A will reside adjacent retaining pin 11 due to the force of gravity. In contrast, when no blockage exists through the flow passageway, indicator 6A will rise to a point within vertical cavity 4 adjacent retaining pin 9, due to the pressure exerted thereon. It can be seen that a visual inspection of the monitor of FIG. 7 will indicate whether a particular vacuum pickup device 36 is blocked, thereby requiring service prior to initiation of the electronic circuit card manufacturing process.

Indicators 6 will remain adjacent the top of pin 9 due in part to the force of gravity and the pressure exerted from chamber 10a into the top of vertical cavity 4a. It can be seen that two of the indicators 6a are adjacent retaining pins 11, thereby indicating a blocked airflow passageway. i.e. fitting 72, tube 16 or pickup device 36 is blocked.

In a manner as previously described, photo sensors 20, having a light beam 22 therebetween, can be utilized to provide an electrical signal indicative of the status of the vacuum pickup devices prior to initiation of the manufacturing process. That is, when the pressure flow is blocked and the indicator 6A resides adjacent retaining pin 11, light beam 22 is broken and the electrical signal is transmitted via wires 24 to the process controller 80 of FIG. 3.

Further, it should be noted that the sensitivity of the monitor of the present invention can be tuned by altering the size and weight of the indicators 6 and 6A. As previously described, these indicators are generally opaque spherical balls. The annular clearance between the indicators 6 and 6A and vertical cavity 4a is dependent upon the size of the indicators 6. 6A. Thus, to alter the threshold at which the indicators 6 and 6A rise vertically within cavity 4a, the size of the ball can be increased, thereby decreasing the clearance between the circumference of the ball and cavity 4a. Further, it should be noted that the ball movement is frictionless, thus making the monitor of the present invention very dependable and reliable.

Although certain preferred embodiments have been shown and described, it should be understood that many changes and modifications may be made therein without departing from the scope of the appended claims. For example, a spring or other bias means can be inserted within vertical cavity 4a adjacent to indicators 6 and 6A. Thus, monitor 1 could be disposed in a manner independent of the force due to gravity. Therefore, cavity 4a would not be required to be oriented vertically.

What is claimed is:

1. An apparatus for sensing the absence of a component on at least one of a plurality of vacuum pickup devices, comprising:

a vacuum source;

a body including a transparent portion having a plurality of cavities, each in communication with said vacuum source and a corresponding one of said vacuum pickup devices;

means included within each of said cavities, for indicating the absence or presence of said component on one of said vacuum pickup devices;

means for correlating said means for indicating with one of said plurality of vacuum pickup devices to determine which ones of said vacuum pickup devices do not have a component thereon; and means for optically sensing a position of said indicating means when said component is absent from any of said plurality of vacuum pickup devices, and for generating an output signal based thereon.

2. An apparatus according to claim 1 wherein said indicating means are axially movable within each of said plurality of cavities, the position of said indicating means within each of said plurality of cavities being dependent on the absence or presence of the component on a corresponding one of said plurality of vacuum pickup devices.

3. An apparatus according to claim 2 wherein said indicating means are disposed intermediate said vacuum source and said plurality of vacuum pickup devices.

4. An apparatus according to claim 3 wherein said indicating means are comprised of opaque spheres.

5. An apparatus according to claim 4, further comprising:

means for receiving said output signal, and for displaying a result of said output signal based on the absence of at least one said component from one of said vacuum pickup devices.

* * * * *